US008790547B2

(12) United States Patent
Namiki et al.

(10) Patent No.: US 8,790,547 B2
(45) Date of Patent: *Jul. 29, 2014

(54) ANISOTROPIC CONDUCTIVE ADHESIVE

(75) Inventors: Hidetsugu Namiki, Tochigi (JP); Shiyuki Kanisawa, Tochigi (JP); Genki Katayanagi, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/517,492

(22) PCT Filed: Jan. 15, 2010

(86) PCT No.: PCT/JP2010/050370

§ 371 (c)(1), (2), (4) Date: Jun. 20, 2012

(87) PCT Pub. No.: WO2011/086680

PCT Pub. Date: Jul. 21, 2011

(65) Prior Publication Data

US 2012/0262931 A1 Oct. 18, 2012

(51) Int. Cl.

| | |
|---|---|
| ***H01B 1/00*** | (2006.01) |
| ***H01B 1/20*** | (2006.01) |
| ***C08L 63/00*** | (2006.01) |

(52) U.S. Cl.

CPC .. *H01B 1/20* (2013.01); *C08L 63/00* (2013.01)
USPC .......................................................... 252/500

(58) Field of Classification Search

USPC ................................. 252/500–521.6; 257/99
See application file for complete search history.

(56) References Cited

U.S. PATENT DOCUMENTS

| | | | | |
|---|---|---|---|---|
| 6,812,065 | B1 | 11/2004 | Kitamura | |
| 2003/0102466 | A1 * | 6/2003 | Kumakura et al. | 252/511 |
| 2005/0045899 | A1 | 3/2005 | Tsutsui | |

FOREIGN PATENT DOCUMENTS

| | | |
|---|---|---|
| CN | 102089398 A | 6/2011 |
| JP | A-5-20918 | 1/1993 |
| JP | A-10-259227 | 9/1998 |
| JP | A-11-335641 | 12/1999 |
| JP | A-2000-345010 | 12/2000 |
| JP | A-2001-115127 | 4/2001 |
| JP | A-2002-201450 | 7/2002 |

(Continued)

OTHER PUBLICATIONS

Office Action issued in Chinese Patent Application No. 201080061381.4 dated May 6, 2013 (with translation).

(Continued)

*Primary Examiner* — Harold Pyon
*Assistant Examiner* — Jaison Thomas
(74) *Attorney, Agent, or Firm* — Oliff PLC

(57) ABSTRACT

An anisotropic conductive adhesive including conductive particles dispersed in an epoxy-based adhesive containing an epoxy compound and a curing agent gives a cured product having the elastic modulus satisfying the expressions (1) to (5), in which $EM^{35}$, $EM^{55}$, $EM^{95}$, and $EM^{150}$ are values of the elastic modulus of the cured product at 35° C., 55° C., 95° C., and 150° C., respectively, $\Delta EM^{55-95}$ is the rate of change in the elastic modulus between 55° C. and 95° C., and $\Delta EM^{95-150}$ is the rate of change in the elastic modulus between 95° C. and 150° C., $$700\ \text{MPa} \le EM^{35} \le 3000\ \text{MPa} \quad (1)$$

$$EM^{150} < EM^{95} < EM^{55} < EM^{35} \quad (2)$$

$$\Delta EM^{55-95} < \Delta EM^{95-150} \quad (3)$$

$$20\% \le \Delta EM^{55-95} \quad (4)$$

$$40\% \le \Delta EM^{95-150} \quad (5).$$

20 Claims, 2 Drawing Sheets

10000
EM35
EM55
1000
EM95
EM150
100
Elastic Modulus (MPa)
10
1
ΔEM55 95
ΔEM95 150
150℃
0 50 100 150 200 250
35℃ 55℃ 95℃
Temperature (℃)

(56) References Cited

FOREIGN PATENT DOCUMENTS

| | | | |
|---|---|---|---|
| JP | B2-3342703 | | 11/2002 |
| JP | A-2003-147306 | | 5/2003 |
| JP | A-2004-39983 | | 2/2004 |
| JP | A-2005-50773 | | 2/2005 |
| JP | A-2006-96834 | | 4/2006 |
| JP | A-2006-104273 | | 4/2006 |
| JP | A-2007-112949 | | 5/2007 |
| JP | A-2010-024301 | | 2/2010 |
| JP | A-2011-100927 | | 5/2011 |
| WO | WO 2005/026284 | A2 | 3/2005 |
| WO | WO 2010/007817 | A1 | 1/2010 |

OTHER PUBLICATIONS

Sep. 20, 2012 International Preliminary Report on Patentability issued in International Application No. PCT/JP2010/050370 (with translation).

International Search Report issued in International Patent Application No. PCT/JP2010/050370 dated Apr. 20, 2010.

Mar. 4, 2014 Notification of Reason(s) for Refusal issued in Japanese Patent Application No. 2011-549816 (with English-language translation).

Mar. 31, 2014 Office Action issued in Chinese Patent Application No. 201080061381.4 (with English-language translation).

* cited by examiner

ANISOTROPIC CONDUCTIVE ADHESIVE

TECHNICAL FIELD

The present invention relates to an anisotropic conductive adhesive.

BACKGROUND ART

In one widely used method of mounting a chip component such as a driver IC or an LED element on a circuit board, the chip component is flip-chip mounted on the circuit board using an anisotropic conductive film prepared by forming an epoxy-based adhesive containing conductive particles dispersed therein into a film shape (Patent Literature 1). In this method, electric connection between the chip component and the circuit board is established through the conductive particles in the anisotropic conductive film, and simultaneously the chip component is secured to the circuit board through the epoxy-based adhesive. Therefore, the connection process is short, and high production efficiency can be achieved.

CITATION LIST

Patent Literature

[Patent Literature 1] Japanese Patent No. 3342703

SUMMARY OF THE INVENTION

Problems to be Solved by the Invention

However, when a chip-mounted product is produced by mounting a chip component on a circuit board using an anisotropic conductive film that uses an epoxy-based adhesive and the obtained chip-mounted product is subjected to a reliability test such as a reflow test that supports lead-free solder, a thermal shock test (TCT), a high-temperature high-humidity test, or a pressure cooker test (PCT), internal stress due to the difference in thermal expansion coefficient between the circuit board and the chip is generated. This may increase the possibility of generating problems in that the conduction resistance between the chip and the circuit will increase and that the chip component will peel off the circuit board. LED devices are recently receiving attention as energy-saving lighting devices but are no exception to these problems.

The present invention has been made to solve the forgoing problems in the conventional technology, and it is an object of the present invention to maintain high conduction reliability between a circuit board and a chip component mounted on the circuit board using an anisotropic conductive adhesive even after the chip-mounted product is subjected to a reliability test involving heating of the chip-mounted product, such as a reflow test that supports lead-free solder, a thermal shock test (TCT), a high-temperature high-humidity test, or a pressure cooker test (PCT). It is also an object to maintain the adhesion between the cured anisotropic conductive adhesive and the circuit board and between the cured adhesive and the chip component in a good condition even after the reliability test.

Means for Solving the Problems

The present inventors have tried to use an anisotropic conductive adhesive that gives a cured product with a reduced elastic modulus, in order to relax internal stress generated in the circuit board, the chip component, and the cured product of the anisotropic conductive adhesive during a reliability test involving heating such as a solder reflow test. The inventors have found that simply reducing the elastic modulus is effective to relax the internal stress but causes a problem in that conduction reliability is significantly reduced. However, the inventors have unexpectedly found that an elastic modulus profile pattern of a curve obtained by plotting the elastic modulus versus temperature is closely related to the results of evaluation of the reliability of anisotropic conductive adhesives and that the relation can be represented by several relational expressions. Thus, the present invention has been completed.

Accordingly, the present invention is an anisotropic conductive adhesive including: an epoxy-based adhesive containing an epoxy compound and a curing agent; and conductive particles dispersed in the epoxy-based adhesive, wherein the following expressions (1) to (5) are satisfied. In the expressions (1) to (5), $EM^{35}$, $EM^{55}$, $EM^{95}$, and $EM^{150}$ are values of the elastic modulus of the cured product at 35° C., 55° C., 95° C., and 150° C., respectively, $\Delta EM^{55\text{-}95}$ is the rate of change in the elastic modulus between 55° C. and 95° C., and $\Delta EM^{95\text{-}150}$ is the rate of change in the elastic modulus between 95° C. and 150° C. The rate of change in the elastic modulus $\Delta EM^{55\text{-}95}$ and the rate of change in the elastic modulus $\Delta EM^{95\text{-}150}$ are defined by the following expressions (6) and (7), respectively.

In the present invention, the elastic modulus is a value measured according to JIS K7244-4. More specifically, the elastic modulus is measured using a dynamic viscoelasticity measuring apparatus (for example, DDV-01FP-W, A&D Company, Limited) in a tension mode under the conditions of a frequency of 11 Hz and a rate of temperature rise of 5° C./min.

$$700\ \text{MPa} \leq EM^{35} \leq 3000\ \text{MPa} \quad (1)$$

$$EM^{150} < EM^{95} < EM^{55} < EM^{35} \quad (2)$$

$$\Delta EM^{55\text{-}95} < \Delta EM^{95\text{-}150} \quad (3)$$

$$20\% \leq \Delta EM^{55\text{-}95} \quad (4)$$

$$40\% \leq \Delta EM^{95\text{-}150} \quad (5)$$

$$\Delta EM^{55\text{-}95}(\%) = \{(EM^{55} - EM^{95})/EM^{55}\} \times 100 \quad (6)$$

$$\Delta EM^{95\text{-}150}(\%) = \{(EM^{95} - EM^{150})/EM^{95}\} \times 100 \quad (7)$$

The present invention also provides a connection structure produced by flip-chip mounting a chip component on a circuit board using the above-described anisotropic conductive adhesive.

Advantageous Effects of Invention

The cured product of the anisotropic conductive adhesive of the present invention has an elastic modulus satisfying the expressions (1) to (5). Therefore, even after a chip-mounted product produced by mounting a chip component on a circuit board using the anisotropic conductive adhesive of the present invention is subjected to a reliability test involving heating of the chip-mounted product, such as a reflow test that supports lead-free solder, a thermal shock test (TCT), a high-temperature high-humidity test, or a pressure cooker test (PCT), high conduction reliability can be maintained between the circuit board and the chip component. In addition, the adhesion between the circuit board and the cured anisotropic conductive adhesive and between the chip component and the cured adhesive can be maintained in a good condition even after the reliability test.

DESCRIPTION OF EMBODIMENTS

The anisotropic conductive adhesive of the present invention contains conductive particles dispersed in an epoxy-based adhesive containing an epoxy compound and a curing agent. When $EM^{35}$, $EM^{55}$, $EM^{95}$, and $EM^{150}$ are values of the elastic modulus of the cured product at 35° C., 55° C., 95° C., and 150° C., respectively, $\Delta EM^{55-95}$ is the rate of change in the elastic modulus between 55° C. and 95° C., and $\Delta EM^{95-150}$ is the rate of change in the elastic modulus between 95° C. and 150° C., the foregoing expressions (1) to (5) are satisfied.

Figure 1:
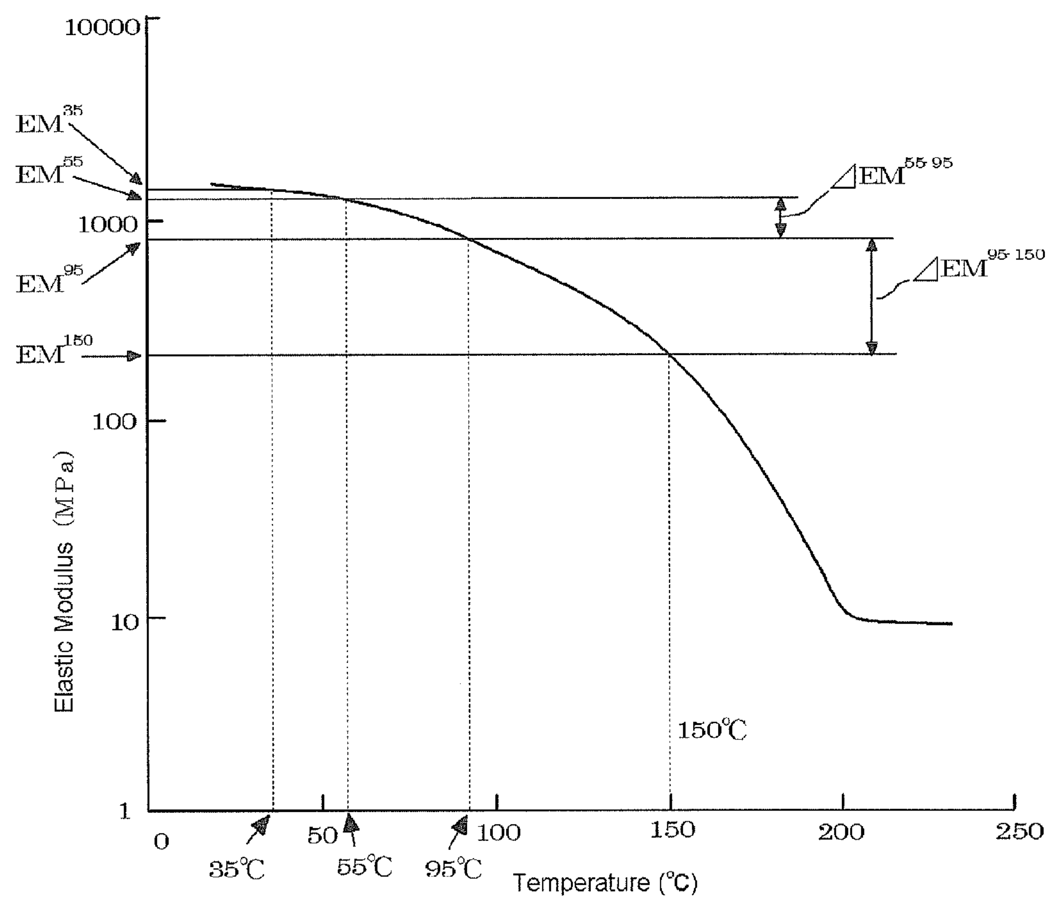
FIG. 1 is a diagram showing the profile of the elastic modulus of the cured product of an anisotropic conductive adhesive of the present invention versus temperature.
Figure 2:
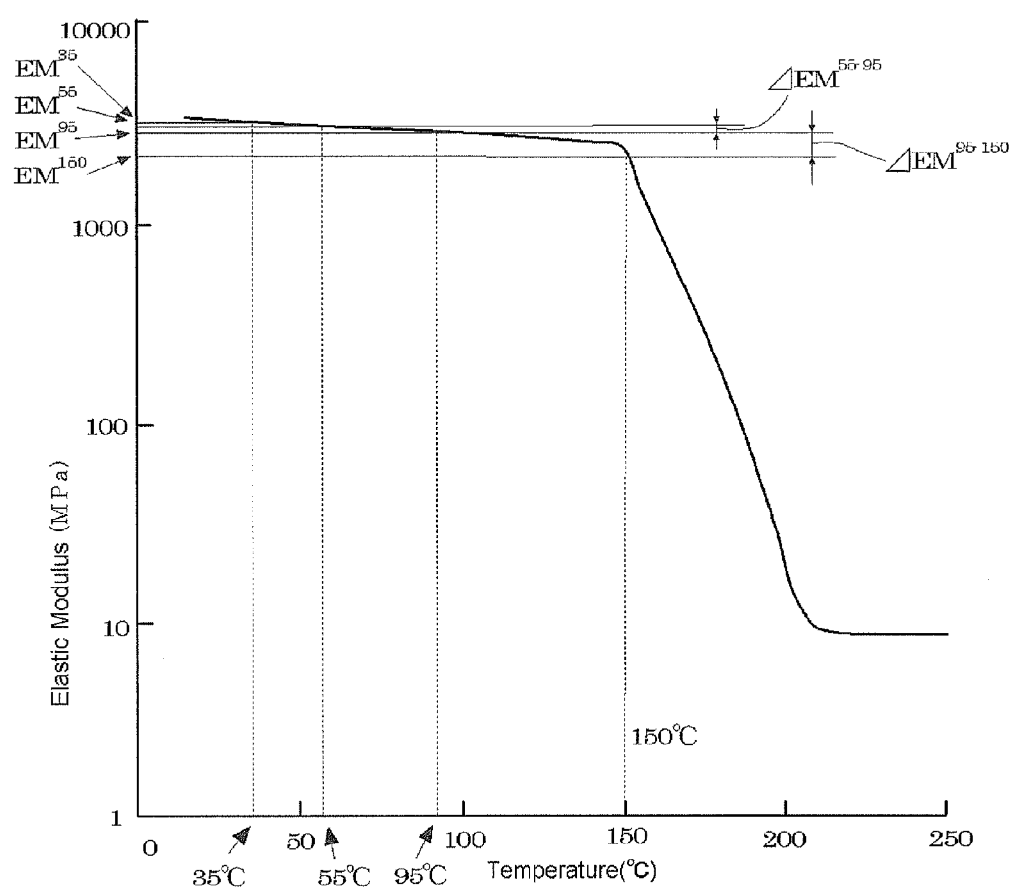
FIG. 2 is a diagram showing the profile of the elastic modulus of the cured product of a conventional anisotropic conductive adhesive versus temperature.

FIG. 1 shows an example of the profile of the elastic modulus satisfying the expressions (1) to (5) (the vertical axis represents the elastic modulus, and the horizontal axis represents temperature). FIG. 2 shows an example of the profile of the elastic modulus of a conventional anisotropic conductive adhesive. The conventional anisotropic conductive adhesive in FIG. 2 contains no prescribed polymer compound. Therefore, the elastic modulus is almost unchanged even when the temperature is increased to some extent. However, the elastic modulus tends to sharply decrease to a large extent when the temperature exceeds a certain temperature higher than the glass transition temperature.

The meanings of the above expressions (1) to (5) that define the anisotropic conductive adhesive of the present invention will next be described in detail.

The expression (1) represents that the elastic modulus at 35° C. of the cured product of the anisotropic conductive adhesive falls within the range of 700 MPa to 3,000 MPa. The reason that the temperature "35° C." is employed is that the change in the elastic modulus of the cured product of an epoxy resin is generally relatively small at temperatures lower than 35° C. and is negligible. This is the meaning to the reference temperature set to 35° C. If the elastic modulus at 35° C. $EM^{35}$ is less than 700 MPa, a problem with the initial conduction reliability occurs. If the elastic modulus at 35° C. $EM^{35}$ is larger than 3,000 MPa, a problem with the conduction reliability after a moisture absorption reflow test is more likely to occur.

The expression (2) represents that the elastic modulus of the cured product of the anisotropic conductive adhesive decreases as the temperature increases from 35° C. to 55° C., 95° C., and 150° C. If the elastic modulus does not decrease as the temperature increases, the internal stress in the adhesive (cured product) increases as the temperature increases. Therefore, a problem with a reduction in adhesion strength and a reduction in conduction reliability is more likely to occur. The temperature of 150° C. has significance in that it corresponds not only to the temperature at which an LED device emits light but also to the temperature at which the anisotropic conductive adhesive is heated during solder reflowing. The reason that the elastic modulus is measured at two points of 55° C. and 95° C. between 35° C. and 150° C. is that, with attention being given to the relation between the effects of the present invention and the rate of reduction in elastic modulus, the use of the values of the elastic modulus measured at two points of 55° C. and 95° C. has been found to be experimentally appropriate.

The expression (3) represents that the rate of change in elastic modulus $\Delta EM^{95-150}$ between 95° C. and 150° C. is larger than the rate of change in elastic modulus $\Delta EM^{55-95}$ between 55° C. and 95° C. If these values are the same, the internal stress is not sufficiently relaxed. If this relation is reversed, the conduction reliability is less likely to be maintained.

The expression (4) represents that the rate of change in elastic modulus $\Delta EM^{55-95}$ between 55° C. and 95° C. is equal to or larger than 20%. If the change is less than 20%, the conduction reliability is less likely to be maintained. The expression (5) represents that the rate of change in elastic modulus $\Delta EM^{95-150}$ between 95° C. and 150° C. is equal to or larger than 40%. If the change is less than 40%, the conduction reliability is less likely to be maintained. Preferred ranges of $\Delta EM^{55-95}$ and $\Delta EM^{95-150}$ are represented by the following expressions (4') and (5').

$$20\% \leq \Delta EM^{55-95} \leq 35\% \quad (4')$$

$$40\% \leq \Delta EM^{95-150} \leq 70\% \quad (5')$$

The specific components of the anisotropic conductive adhesive of the present invention that gives a cured product having an elastic modulus with the above-described characteristics will next be described. As described above, the anisotropic conductive adhesive of the present invention includes conductive particles dispersed in an epoxy-based adhesive containing an epoxy compound and a curing agent.

Preferred examples of the epoxy compound may include compounds and resins having at least two epoxy groups in their molecules. These may be a liquid form or a solid form. Specific examples may include well-known epoxy resins such as: glycidyl ethers obtained by reacting epichlorohydrin with a polyphenol such as bisphenol A, bisphenol F, bisphenol S, hexahydrobisphenol A, tetramethylbisphenol A, diarylbisphenol A, hydroquinone, catechol, resorcin, cresol, tetrabromobisphenol A, trihydroxybiphenyl, benzophenone, bisresorcinol, bisphenolhexafluoroacetone, tetramethylbisphenol A, tetramethylbisphenol F, tris(hydroxyphenyl) methane, bixylenol, phenol-novolac, and cresol novolac; polyglycidyl ethers obtained by reacting epichlorohydrin with an aliphatic polyalcohol such as glycerin, neopentyl glycol, ethylene glycol, propylene glycol, butylene glycol, hexylene glycol, polyethylene glycol, and polypropylene glycol; glycidyl ether esters obtained by reacting epichlorohydrin with a hydroxy carboxylic acid such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, hexahydrophthalic acid, endomethylenetetrahydrophthalic acid, endomethylenehexahydrophthalic acid, trimellitic acid, and polymerized fatty acids; glycidylaminoglycidyl ethers obtained from aminophenol and aminoalkylphenols; glycidylaminoglycidyl esters obtained from aminobenzoic acid; glycidylamines obtained from aniline, toluidine, tribromoaniline, xylylenediamine, diaminocyclohexane, bisaminomethylcyclohexane, 4,4'-diaminodiphenyl methane, 4,4'-diaminodiphenyl sulfone, and the like; and epoxidized polyolefins.

Of these, alicyclic epoxy compounds can be preferably used because the cured product can have light transmittance suitable for a mounted LED element and the like. Specific examples of the alicyclic epoxy compounds may include a hydrogenated product of glycidylbisphenol A (glycidyl hexahydrobisphenol A), 3,4-epoxycyclohexenylmethyl-3',4'-epoxycyclohexene carboxylate, and tris(2,3-epoxypropyl) isocyanurate (TEPIC).

Any known curing agent for epoxy compounds may be used as the above curing agent, and the curing agent used may be a latent curing agent. For example, any of acid anhydride-based curing agents, amine-based curing agents, imidazole-based curing agents, and the like may be used. Of these, alicyclic acid anhydride-based curing agents may be preferably used because the cured product can have light transmittance suitable for a mounted LED element and the like. Specific examples of the alicyclic acid anhydride-based curing agents include methylhexahydrophthalic anhydride.

With regard to the amounts used of the epoxy compound and curing agent in the epoxy-based adhesive, if the amount used of the curing agent is too small, the amount of uncured epoxy compound becomes large. If the amount used is too large, the excess curing agent tends to facilitate the corrosion of an adhesion target. Therefore, the curing agent is used in an amount of preferably 80 to 120 parts by mass based on 100 parts by mass of the epoxy compound, and more preferably 95 to 105 parts by mass.

In the present invention, it is preferable that the epoxy-based adhesive should contain, in addition to the epoxy compound and the curing agent, a polymer compound, for the purpose of relaxing the internal stress. The effect of relaxing the internal stress is small when the weight average molecular weight of the polymer compound is too small or too large. Therefore, a polymer compound having a weight average molecular weight of preferably 5,000 to 200,000, more preferably 10,000 to 100,000, is used. In addition, since the effect of relaxing the internal stress is small when the glass transition temperature of the polymer compound is too high, a polymer compound having a glass transition temperature of preferably 50° C. or lower, more preferably −30 to 10° C., is used.

Specific examples of such a polymer compound may include acrylic resins, rubbers (NBR, SBR, NR, SIS, and hydrogenated products thereof), and olefin resins. Preferably, the polymer compound has a functional group such as a glycidyl group or an amino group. Preferred examples of the polymer compound may include acrylic resins because they can provide good heat resistant properties. Specific examples of the acrylic resins may include copolymers of alkyl esters having 2 to 8 carbon atoms, preferably alkyl esters having 4 to 8 carbon atoms, of (meth)acrylic acid with glycidyl (meth) acrylate or dialkylaminoalkyl (meth)acrylate. Preferred examples of the alkyl esters having 2 to 8 carbon atoms of (meth)acrylic acid may include ethyl acrylate, butyl acrylate, and 2-ethylhexyl acrylate. Preferred examples of the glycidyl (meth)acrylate may include glycidyl methacrylate, and preferred examples of the dialkylaminoalkyl (meth)acrylate may include diethylaminoethyl acrylate.

Particularly preferred examples of the acrylic resin composed of the above-described components may include an acrylic resin prepared by copolymerization of 100 parts by mass of ethyl acrylate, butyl acrylate, or 2-ethylhexyl acrylate with 10 to 100 parts by mass, preferably 10 to 40 parts by mass, of glycidyl methacrylate or diethylaminoethyl acrylate. Particularly, an acrylic resin prepared by copolymerization of 100 parts by mass of butyl acrylate with 10 to 100 parts by mass, preferably 10 to 40 parts by mass, of glycidyl methacrylate is preferred because this acrylic resin has an advantage in that it is less likely to cause corrosion of silver wiring lines and silver electrodes.

If the amount used of such a polymer compound in the epoxy-based adhesive is too small, the effect of relaxing the internal stress becomes low. If the amount used is too large, it tends to be difficult to maintain the conduction reliability. Therefore, the amount used of the polymer compound is preferably 10 to 50 parts by mass based on 100 parts by mass of the total amount of the epoxy compound, the curing agent, and the polymer compound, and more preferably 10 to 30 parts by mass.

If necessary, an imidazole compound used as a curing promoter may be added to the epoxy-based adhesive. Specific examples of the imidazole compound include 2-methyl-4-ethyl imidazole. If the amount used of the imidazole compound is too small, the amount of uncured component increases. If the amount used is too large, the excess curing promoter tends to facilitate the corrosion of an adhesion target. Therefore, the amount used of the imidazole compound is preferably 0.01 to 10 parts by mass based on 100 parts by mass of the curing agent and more preferably 0.1 to 5 parts by mass.

Conductive particles conventionally used for anisotropic conductive adhesives can be used as the conductive particles constituting the epoxy-based adhesive. For example, metal particles such as gold, nickel, and solder particles, resin particles plated with a metal, particles produced by coating any of the above particles with an insulating thin film, and the like may be appropriately used. The conductive particles, as in conventional conductive particles, have a diameter of generally 3 to 10 μm. To ensure good anisotropic conduction properties and conduction reliability, the amount used of the conductive particles is preferably 1 to 100 parts by mass based on 100 parts by mass of the epoxy-based adhesive and more preferably 10 to 50 parts by mass.

If necessary, any of various additives used for conventional anisotropic conductive adhesives may be added to the anisotropic conductive adhesive of the present invention. For example, a silane coupling agent, a filler, a UV absorber, an antioxidant, and the like may be added.

The anisotropic conductive adhesive of the present invention can be produced by uniformly dispersing the conductive particles in the epoxy-based adhesive using a common method. The anisotropic conductive adhesive may be processed into a desired form such as a paste form, a film form, or a highly viscous liquid form using a common method. The anisotropic conductive adhesive is of the thermosetting type and can be cured by heating to generally 150 to 250° C.

The anisotropic conductive adhesive of the present invention can be preferably used to connect a chip component and various modules to a circuit board. Particularly, in a connection structure produced by flip-chip mounting a chip component such as an IC chip or an LED element on a circuit board using the anisotropic conductive adhesive of the present invention, high conduction reliability can be maintained between the circuit board and the chip component even after the chip-mounted product is subjected to a reliability test involving heating of the chip-mounted product such as a reflow test that supports lead-free solder, a thermal shock test (TCT), a high-temperature high-humidity test, or a pressure cooker test (PCT). In addition, the adhesion between the circuit board and the cured anisotropic conductive adhesive and between the chip component and the cured adhesive can be maintained in a good condition even after the reliability test.

EXAMPLES

The present invention will next be specifically described by way of Examples.

Reference Example 1

Production of Acrylic Resin A

A four-necked flask equipped with a stirrer and a condenser tube was charged with 100 g of ethyl acrylate (EA), 10 g of glycidyl methacrylate (GMA), 0.2 g of azobisbutyronitrile, 300 g of ethyl acetate, and 5 g of acetone. The mixture was subjected to a polymerization reaction at 70° C. for 8 hours under stirring. Then precipitated particles were collected by filtration, washed with ethanol, and dried to obtain acrylic resin A. The weight average molecular weight of the obtained acrylic resin A was 80,000, and its glass transition temperature was −40° C.

Reference Example 2

Production of Acrylic Resin B

A four-necked flask equipped with a stirrer and a condenser tube was charged with 100 g of ethyl acrylate (EA), 10 g of dimethylaminoethyl acrylate (DMAEA), 0.2 g of azobisbutyronitrile, 300 g of ethyl acetate, and 5 g of acetone. The mixture was subjected to a polymerization reaction at 70° C. for 8 hours under stirring. Then precipitated particles were collected by filtration, washed with ethanol, and dried to obtain acrylic resin B. The weight average molecular weight of the obtained acrylic resin B was 80,000, and its glass transition temperature was 18° C.

Reference Example 3

Production of Acrylic Resin C

A four-necked flask equipped with a stirrer and a condenser tube was charged with 100 g of butyl acrylate (BA), 10 g of glycidyl methacrylate (GMA), 0.2 g of azobisbutyronitrile, 300 g of ethyl acetate, and 5 g of acetone. The mixture was subjected to a polymerization reaction at 70° C. for 8 hours under stirring. Then precipitated particles were collected by filtration, washed with ethanol, and dried to obtain acrylic resin C. The weight average molecular weight of the obtained acrylic resin C was 80,000, and its glass transition temperature was −70° C.

Reference Example 4

Production of Acrylic Resin D

A four-necked flask equipped with a stirrer and a condenser tube was charged with 100 g of 2-ethylhexyl acrylate (2EHA), 10 g of glycidyl methacrylate (GMA), 0.2 g of azobisbutyronitrile, 300 g of ethyl acetate, and 5 g of acetone. The mixture was subjected to a polymerization reaction at 70° C. for 8 hours under stirring. Then precipitated particles were collected by filtration, washed with ethanol, and dried to obtain acrylic resin D. The weight average molecular weight of the obtained acrylic resin D was 80,000, and its glass transition temperature was −69° C.

Examples 1 to 6 and Comparative Examples 1 to 5

Anisotropic conductive adhesives were prepared by uniformly mixing components in compounding ratios shown in Table 1 using a planetary mixer.

Evaluation Tests

The adhesion, elastic modulus, and conduction reliability of each of the paste-like anisotropic conductive adhesives obtained in Examples 1 to 6 and Comparative Examples 1 to 5 were measured as described below.

<Adhesion Test>

A glass epoxy circuit board having Cu traces flash-plated with Au was coated with one of the paste-like anisotropic conductive adhesives to a thickness (dry thickness) of 25 μm. A 1.5-mm square IC chip was placed on the applied adhesive and heated at 180° C. for 30 seconds using a flip chip bonder to thermocompression-bond the IC chip, and a connection structure was thereby obtained. The adhesion strength (N/chip) of the IC chip in the connection structure was measured using a die shear tester (bond tester RTR-1100, RHESCA Co., Ltd.) immediately after the thermocompression-bonding (initial), after reflowing (260° C.), and after the connection structure was left to stand at 150° C. for 100 hours. The results obtained are shown in Table 1. The adhesion as measured under the conditions of the above adhesion test is practically preferably 50 N/chip.

<Measurement of Elastic Modulus>

One of the anisotropic conductive adhesives was applied to release-treated PET to a dry thickness of 80 μm and placed in a furnace at 150° C. to cure the adhesive. Then the cured product was peeled off the release-treated PET and cut into strips (specimens) of a length of 3.5 cm and a width of 0.4 cm. The values of the elastic modulus of the specimens at 35° C., 55° C., 95° C., and 150° C. ($EM^{35}$, $EM^{55}$, $EM^{95}$, and $EM^{150}$) were measured using a dynamic viscoelasticity measuring apparatus (DDV-01FP-W, A&D Company, Limited, tension mode, frequency: 11 Hz, rate of temperature rise: 5° C./min). The rates of change in the elastic modulus ($\Delta EM^{55\text{-}95}$ and $\Delta EM^{95\text{-}150}$) were computed from the obtained results using the expressions (6) and (7). The results obtained are shown in Table 1.

<Conduction Reliability Test>

A glass epoxy circuit board having Cu traces flash-plated with Au was coated with one of the paste-like anisotropic conductive adhesives to a thickness (dry thickness) of 25 μm. A 6.3-mm square IC chip was placed on the applied adhesive and heated at 180° C. for 30 seconds using a flip chip bonder to thermocompression-bond the IC chip. The conduction resistance of the connection structure immediately after thermocompression bonding was measured by the four-terminal method. Then the connection structure was subjected to a level 4 moisture absorption reflow test (moisture absorption conditions: the connection structure was left to stand in an environment of 30° C. and 60% RH for 96 hours; reflow conditions: 260° C. (reflow peak temperature)) or a level 2 moisture absorption reflow test (moisture absorption conditions: the connection structure was left to stand in an environment of 85° C. and 60% RH for 168 hours; reflow conditions: reflow peak temperature of 260° C.), and then the conduction resistance was measured. After the measurement, the connection structure was subjected to a thermal shock test (TCT: −55° C. for 0.5 hr←→125° C. for 0.5 hr, 500 cycles), and the conduction resistance was again measured. The connection structure was evaluated as "good (G)" when the conduction resistance was less than 1Ω and as "not good (NG)" when the conduction resistance was 1Ω or larger. The results obtained are shown in Table 1.

TABLE 1

| Component Name (Parts By Mass) | | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|---|
| Alicyclic Epoxy Compound *1 | | 50 | 39 | 28 | 50 | 39 | 39 | 50 | 22 | 90 | 50 | 42 |
| Acrylic Resin A *2 | | 10 | 30 | 50 | — | — | — | — | 60 | — | — | 2 |
| Acrylic Resin B *3 | | — | — | — | 30 | — | — | — | — | — | — | — |
| Acrylic Resin C *4 | | — | — | — | — | 30 | — | — | — | — | — | — |
| Acrylic Resin D *5 | | — | — | — | — | — | 30 | | — | — | — | — |
| Phenoxy Resin *6 | | — | — | — | — | — | — | 10 | — | 10 | 10 | — |
| Curing Agent *7 | | 40 | 31 | 22 | 40 | 31 | 31 | 40 | 18 | — | 40 | 56 |
| Curing Promoter *8 | | 1 | 1 | 1 | 1 | 1 | 1 | — | 1 | 10 | 1 | 1 |
| Conductive Particles *9 | | 30 | 30 | 30 | 30 | 30 | 30 | 30 | 30 | 30 | 30 | 30 |
| Adhesion (N/Chip) | Initial | 98.0 | 107.8 | 127.4 | 98.0 | 90.0 | 85.0 | 39.2 | 127.4 | 49.0 | 49.0 | 49.0 |
| | After Reflowing | 98.0 | 107.4 | 117.6 | 98.0 | 90.0 | 85.0 | 19.6 | 107.4 | 39.2 | 39.2 | 39.2 |
| | 150° C. 100 h | 78.4 | 88.2 | 98.0 | 88.2 | 75.0 | 65.0 | 9.8 | 39.2 | 19.6 | 19.6 | 29.4 |
| Elastic Modulus (Mpa) | $EM^{35}$ | 2600 | 1400 | 900 | 1600 | 2000 | 2100 | 3200 | 600 | 1900 | 1700 | 2100 |
| | $EM^{55}$ | 2200 | 1100 | 700 | 1200 | 1800 | 1800 | 2900 | 400 | 1700 | 1700 | 1900 |
| | $EM^{95}$ | 1500 | 830 | 500 | 800 | 1200 | 1500 | 2600 | 300 | 1500 | 1600 | 1500 |
| | $EM^{150}$ | 800 | 270 | 200 | 400 | 380 | 680 | 2500 | 100 | 46 | 1300 | 1000 |
| Rate of Change in | $\Delta EM^{55\text{-}95}$ | 32 | 25 | 29 | 33 | 33 | 25 | 10 | 25 | 12 | 6 | 21 |
| Elastic Modulus (%) | $\Delta EM^{95\text{-}150}$ | 47 | 67 | 60 | 50 | 67 | 55 | 4 | 67 | 97 | 19 | 33 |
| Conduction Reliability | Initial | G | G | G | G | G | G | G | NG | G | G | G |
| After Level 4 Moisture Absorption Reflowing | | G | G | G | G | G | G | G | — | G | G | G |
| After Level 2 Moisture Absorption Reflowing | | G | G | G | G | G | G | NG | — | NG | NG | NG |
| After 500 TCT Cycles | | G | G | G | G | G | G | — | — | — | — | — |

*1 GLYCIDYL HEXAHYDROBISPHENOL A (YX8000, JER CO., LTD.)
*2 REFERENCE EXAMPLE 1
*3 REFERENCE EXAMPLE 2
*4 REFERENCE EXAMPLE 3
*5 REFERENCE EXAMPLE 4
*6 WEIGHT AVERAGE MOLECULAR WEIGHT: 3700, GLASS TRANSITION TEMPERATURE: 70° C. (YP70, TOHTO KASEI CO., LTD.)
*7 METHYLHEXAHYDROPHTHALIC ANHYDRIDE
*8 2-ETHYL-4-METHYL IMIDAZOLE (SHIKOKU CHEMICALS CORPORATION)
*9 Particles prepared by plating surface of cross-linked polystyrene particles of 5 μm diameter with Ni/Au As can be seen from the results in Table 1, in the anisotropic conductive adhesives in Examples 1 to 6 having an elastic modulus satisfying the expressions (1) to (5) below, their initial adhesion, adhesion after reflowing, and adhesion after 100 hours at 150° C. were good. As also can be seen from the results, the initial conduction reliability, conduction reliability after the level 4 moisture absorption reflowing, conduction reliability after the level 2 moisture absorption reflowing, and conduction reliability after 500 thermal shock cycles were good. The anisotropic conductive adhesive in Example 5 prepared using a polymer compound obtained by reacting acrylic resin C with glycidyl methacrylate could prevent corrosion of silver wiring lines and silver electrodes in anisotropic conduction connection portions more effectively than the anisotropic conductive adhesives in other Examples.

$$700\ \text{MPa} \leq EM^{35} \leq 3000\ \text{MPa} \quad (1)$$

$$EM^{150} < EM^{95} < EM^{55} < EM^{35} \quad (2)$$

$$\Delta EM^{55\text{-}95} < \Delta EM^{95\text{-}150} \quad (3)$$

$$20\% \leq \Delta EM^{55\text{-}95} \quad (4)$$

$$40\% \leq \Delta EM^{95\text{-}150} \quad (5)$$

However, in Comparative Example 1, since $EM^{35}$ is higher than 3,000 MPa, the expression (1) is not satisfied, and also the expressions (3) to (5) are not satisfied. Therefore, not only the desired adhesion, but also the desired conduction reliability were not achieved after the moisture absorption reflow test performed under severer conditions.

In Comparative Example 2, since $EM^{35}$ is less than 700 MPa, the expression (1) is not satisfied. Therefore, the desired adhesion characteristics were not obtained after the connection structure was left to stand at 150° C. for 100 hours. In addition, the desired conduction reliability was not obtained even immediately after the production of the connection structure.

In Comparative Example 3, since the rate of change in elastic modulus $\Delta EM^{55\text{-}95}$ is less than 20%, the expression (4) is not satisfied. Therefore, the desired adhesion characteristics were not obtained after reflowing and after the connection structure was left to stand at 150° C. for 100 hours. The desired conduction reliability was not achieved after the moisture absorption reflow test performed under severer conditions.

In Comparative Example 4, since the rate of change in elastic modulus $\Delta EM^{55\text{-}95}$ is less than 20% and also $\Delta EM^{95\text{-}150}$ is less than 40%, the expressions (4) and (5) are not satisfied. Therefore, the desired adhesion characteristics were not obtained after reflowing and after the connection structure was left to stand at 150° C. for 100 hours. The desired conduction reliability was not achieved after the moisture absorption reflow test performed under severer conditions.

In Comparative Example 5, since the rate of change in elastic modulus $\Delta EM^{95\text{-}150}$ is less than 40, the expression (5) is not satisfied. Therefore, the desired adhesion characteristics were not obtained after reflowing and after the connection structure was left to stand at 150° C. for 100 hours. The desired conduction reliability was not achieved after the moisture absorption reflow test performed under severer conditions.

INDUSTRIAL APPLICABILITY

The anisotropic conductive adhesive of the present invention yields a cured product having an elastic modulus that satisfies the expressions (1) to (5). Therefore, even after a chip-mounted product produced by mounting a chip component on a circuit board using the anisotropic conductive adhesive of the present invention is subjected to a reliability test involving heating of the chip-mounted product, such as a reflow test that supports lead-free solder, a thermal shock test (TCT), a high-temperature high-humidity test, or a pressure cooker test (PCT), high conduction reliability is maintained between the circuit board and the chip component. In addition, the adhesion between the circuit board and the cured anisotropic conductive adhesive and between the chip component and the cured adhesive can be maintained in a good condition even after the reliability test. Therefore, the anisotropic conductive adhesive of the present invention is useful for connection of a circuit board to electronic components such as various chip components, modules, and flexible circuit boards.

The invention claimed is:

1. An anisotropic conductive adhesive comprising:

an epoxy-based adhesive containing an epoxy compound and a curing agent in an amount of 80 to 120 parts by mass based on 100 parts by mass of the epoxy compound; and conductive particles dispersed in the epoxy-based adhesive, wherein the following expressions (1) to (5) are satisfied, in which $EM^{35}$, $EM^{55}$, $EM^{95}$, and $EM^{150}$ are values of an elastic modulus of a cured product of the adhesive at 35° C., 55° C., 95° C., and 150° C., respectively, $\Delta EM^{55-95}$ is a rate of change in the elastic modulus between 55° C. and 95° C., and $\Delta EM^{95-150}$ is a rate of change in the elastic modulus between 95° C. and 150° C., $$700\ \text{MPa} \leq EM^{35} \leq 3000\ \text{MPa} \quad (1)$$

$$EM^{150} < EM^{95} < EM^{55} < EM^{35} \quad (2)$$

$$\Delta EM^{55-95} < \Delta EM^{95-150} \quad (3)$$

$$20\% \leq \Delta EM^{55-95} \quad (4)$$

$$40\% \leq \Delta EM^{95-150} \quad (5).$$

2. The anisotropic conductive adhesive according to claim 1, wherein the rates of change in the elastic modulus $\Delta EM^{55-95}$ and $\Delta EM^{95-150}$ satisfy the respective expressions (4') and (5'), $$20\% \leq \Delta EM^{55-95} \leq 35\% \quad (4')$$

$$40\% \leq \Delta EM^{95-150} \leq 70\% \quad (5').$$

3. The anisotropic conductive adhesive according to claim 1, wherein the epoxy-based adhesive contains the curing agent in an amount of 95 to 105 parts by mass based on 100 parts by mass of the epoxy compound.

4. The anisotropic conductive adhesive according to claim 1, wherein the epoxy-based adhesive contains, in addition to the epoxy compound, a polymer compound having a weight average molecular weight of 5,000 to 200,000 and a glass transition temperature of 50° C. or lower.

5. The anisotropic conductive adhesive according to claim 4, wherein the polymer compound is a copolymer of an alkyl ester having 2 to 8 carbon atoms of (meth)acrylic acid with glycidyl (meth)acrylate or dialkylaminoalkyl (meth)acrylate.

6. The anisotropic conductive adhesive according to claim 4, wherein the polymer compound is an acrylic resin prepared by copolymerization of 100 parts by mass of ethyl acrylate, butyl acrylate, or 2-ethylhexyl acrylate with 10 to 100 parts by mass of glycidyl methacrylate or diethylaminoethyl acrylate.

7. The anisotropic conductive adhesive according to claim 4, wherein the polymer compound is an acrylic resin prepared by copolymerization of 100 parts by mass of butyl acrylate with 10 to 100 parts by mass of glycidyl methacrylate.

8. The anisotropic conductive adhesive according to claim 4, wherein an amount used of the polymer compound in the epoxy-based adhesive is 10 to 50 parts by mass based on 100 parts by mass of a total amount of the epoxy compound, the curing agent, and the polymer compound.

9. The anisotropic conductive adhesive according to claim 1, wherein an amount used of the conductive particles is 1 to 100 parts by mass based on 100 parts by mass of the epoxy-based adhesive.

10. A connection structure produced by flip-chip mounting a chip component on a circuit board using the anisotropic conductive adhesive according to claim 1.

11. The connection structure according to claim 10, wherein the chip component is an LED element.

12. An anisotropic conductive adhesive comprising:

an epoxy-based adhesive containing an alicyclic epoxy compound and an alicyclic acid anhydride-based curing agent; and conductive particles dispersed in the epoxy-based adhesive, wherein the following expressions (1) to (5) are satisfied, in which $EM^{35}$, $EM^{55}$, $EM^{95}$, and $EM^{150}$ are values of an elastic modulus of a cured product of the adhesive at 35° C., 55° C., 95° C., and 150° C., respectively, $\Delta EM^{55-95}$ is a rate of change in the elastic modulus between 55° C. and 95° C., and $\Delta EM^{95-150}$ is a rate of change in the elastic modulus between 95° C. and 150° C., $$700\ \text{MPa} \leq EM^{35} \leq 3000\ \text{MPa} \quad (1)$$

$$EM^{150} < EM^{95} < EM^{55} < EM^{35} \quad (2)$$

$$\Delta EM^{55-95} < \Delta EM^{95-150} \quad (3)$$

$$20\% \leq \Delta EM^{55-95} \quad (4)$$

$$40\% \leq \Delta EM^{95-150} \quad (5).$$

13. The anisotropic conductive adhesive according to claim 12, wherein the alicyclic epoxy compound is a hydrogenated product of glycidylbisphenol A or 3,4-epoxycyclohexenylmethyl-3',4'-epoxycyclohexene carboxylate, and the alicyclic acid anhydride-based curing agent is methylhexahydrophthalic anhydride.

14. The anisotropic conductive adhesive according to claim 12, wherein the rates of change in the elastic modulus $\Delta EM^{55-95}$ and $\Delta EM^{95-150}$ satisfy the respective expressions (4') and (5'), $$20\% \leq \Delta EM^{55-95} \leq 35\% \quad (4')$$

$$40\% \leq \Delta EM^{95-150} \leq 70\% \quad (5').$$

15. A connection structure produced by flip-chip mounting a chip component on a circuit board using the anisotropic conductive adhesive according to claim 12.

16. The connection structure according to claim 15, wherein the chip component is an LED element.

17. An anisotropic conductive adhesive comprising:

an epoxy-based adhesive containing an epoxy compound and a curing agent;

conductive particles dispersed in the epoxy-based adhesive; and 2-methyl-4-ethyl imidazole as a curing promoter in an amount of 0.01 to 10 parts by mass based on 100 parts by mass of the curing agent, wherein the following expressions (1) to (5) are satisfied, in which $EM^{35}$, $EM^{55}$, $EM^{95}$, and $EM^{150}$ are values of an elastic modulus of a cured product of the adhesive at 35° C., 55° C., 95° C., and 150° C., respectively, $\Delta EM^{55-95}$ is a rate of chance in the elastic modulus between 55° C. and 95° C., and $\Delta EM^{95-150}$ is a rate of change in the elastic modulus between 95° C. and 150° C., $$700\ \text{MPa} \leq EM^{35} \leq 3000\ \text{MPa} \quad (1)$$

$$EM^{150} < EM^{95} < EM^{55} < EM^{35} \quad (2)$$

$$\Delta EM^{55-95} < \Delta EM^{95-150} \quad (3)$$

$$20\% \leq \Delta EM^{55-95} \quad (4)$$

$$40\% \leq \Delta EM^{95-150} \quad (5).$$

18. The anisotropic conductive adhesive according to claim 17, wherein the rates of change in the elastic modulus $\Delta EM^{55-95}$ and $\Delta EM^{95-150}$ satisfy the respective expressions (4') and (5'), $$20\% \leq \Delta EM^{55-95} \leq 35\% \quad (4')$$

$$40\% \leq \Delta EM^{95-150} \leq 70\% \quad (5').$$

19. A connection structure produced by flip-chip mounting a chip component on a circuit board using the anisotropic conductive adhesive according to claim 17.

20. The connection structure according to claim 19, wherein the chip component is an LED element.

* * * * *